US012603631B2

(12) United States Patent
Loxha et al.

(10) Patent No.: US 12,603,631 B2
(45) Date of Patent: Apr. 14, 2026

(54) VARACTOR-TUNABLE RADIO FREQUENCY RESONANT CIRCUITS AND COMPONENTS

(71) Applicant: Knowles Cazenovia, Inc., Cazenovia, NY (US)

(72) Inventors: Denis Loxha, New York, NY (US); Gregory Charles Alton, Cazenovia, NY (US)

(73) Assignee: Knowles Cazenovia, Inc., Cazenovia, NY (US)

( * ) Notice: Subject to any disclaimer, the term of this patent is extended or adjusted under 35 U.S.C. 154(b) by 290 days.

(21) Appl. No.: 18/380,566

(22) Filed: Oct. 16, 2023

(65) Prior Publication Data

US 2025/0125782 A1     Apr. 17, 2025

(51) Int. Cl.
H03H 7/25          (2006.01)
H03H 7/01          (2006.01)
H03H 7/40          (2006.01)

(52) U.S. Cl.
CPC .......... H03H 7/0153 (2013.01); H03H 7/256 (2013.01); H03H 7/40 (2013.01)

(58) Field of Classification Search
CPC ......... H03H 7/256; H03H 7/0153; H03H 7/40
USPC .......................................................... 333/193
See application file for complete search history.

(56) References Cited

U.S. PATENT DOCUMENTS 5,760,661 A * 6/1998 Cohn ...................... H01P 1/185
                                                      333/164
5,942,950 A * 8/1999 Merenda .............. H03B 5/1847
                                                      331/177 V

* cited by examiner

*Primary Examiner* — Andrea Lindgren Baltzell
*Assistant Examiner* — Abigail Amir Yaldo
(74) *Attorney, Agent, or Firm* — Hickman Becker Bingham Ledesma LLP; Matthew Loppnow

(57)          ABSTRACT

A varactor-tunable radio frequency (RF) resonant circuit is disclosed. The circuit includes a planar impedance-controlled transmission line disposed on a dielectric substrate, and a voltage-controlled varactor diode, or an arrangement of parallel varactor diodes, electrically connecting a resonator of the planar transmission line to a reference node. The resonator can have a stepped impedance. A frequency of the resonator is tunable by configuration of a reverse bias voltage applied to the first plurality of voltage-controlled varactor diodes.

20 Claims, 6 Drawing Sheets

VARACTOR-TUNABLE RADIO FREQUENCY RESONANT CIRCUITS AND COMPONENTS

FIELD OF THE DISCLOSURE

The present disclosure relates generally to tunable radio frequency (RF) circuits and more particularly to varactor-tunable RF resonant circuits configurable as tunable filters and other RF components.

BACKGROUND

Tunable RF filters and other RF components are used pervasively in terrestrial and satellite communications, aerospace, avionics, radar, medical implants, automotive, and industrial applications among others. These components can operate at microwave frequencies and often require relatively low insertion loss and high Q factors. The ability to manufacture such components with precision and high yield are also strong considerations in the increasingly competitive marketplace. Thus, there is an ongoing need for improvements in tunable RF components.

BRIEF DESCRIPTION OF THE DRAWINGS

The objects, features and advantages of the present disclosure will become more fully apparent upon consideration of the following detailed description and appended claims in conjunction with the accompanying drawings. The drawings depict only representative embodiments and are not considered to limit the scope of the disclosure.

Figure 1:
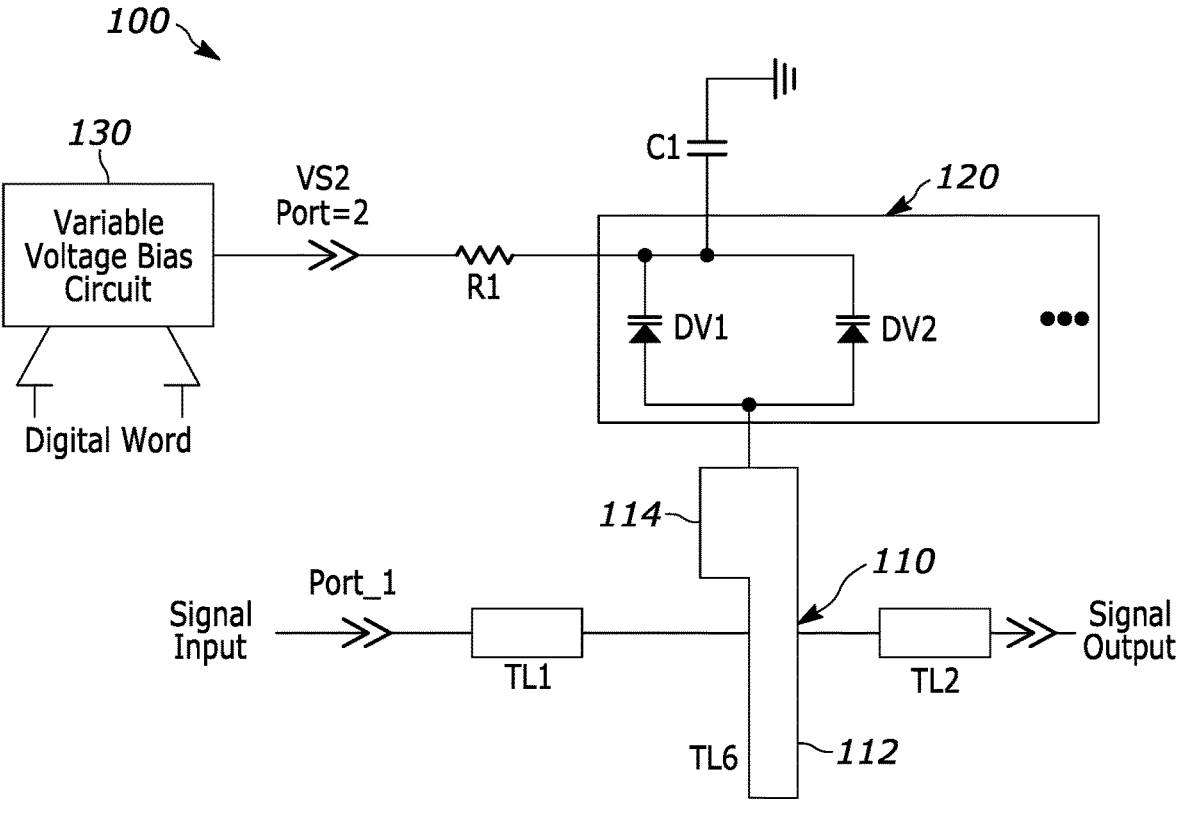
FIG. 1 is a schematic block diagram of a varactor-tunable radio frequency (RF) resonant circuit.

Those of ordinary skill in the art will appreciate that the drawings are illustrated for simplicity and clarity and therefore may not be drawn to scale and may not include well-known features, that the order of occurrence of actions or steps may be different than the order described, that the order of occurrence of such actions or steps may be performed concurrently unless specified otherwise, and that the terms and expressions used herein have meaning understood by those of ordinary skill in the art except where a different meaning is specifically attributed to them herein.

DETAILED DESCRIPTION

The disclosure relates to varactor-tunable radio frequency (RF) resonant circuits configurable as tunable RF filters and other RF components. In this specification, RF includes microwave frequencies. Such components comprise antennas, filters and oscillators, among other devices in which tuning of a resonant frequency is desired, and combinations thereof. These and other RF components can be fabricated with very small footprints for use in small-scale RF systems, devices and subassemblies. Representative examples are described herein.

The varactor-tunable radio frequency (RF) resonant circuits described herein generally comprise one or more planar impedance-controlled transmission lines disposed on a dielectric substrate. The planar transmission lines can be implemented as a microstrip, stripline, coplanar waveguide or other impedance-controlled transmission lines comprising a conductive film patterned or otherwise formed as a distributed-element circuit on the substrate. The distributed-element circuit can be configured as one or more resonant elements and other structures that perform various electrical functions through appropriate patterning of the conductive film. Distributed-element circuits configured to function as antennas, filters, and oscillators, among other RF devices and combinations thereof are known generally to those of ordinary skill in the art and are not described further herein. The RF components described herein can be manufactured with precision, high yield, and at low cost by depositing the distributed-element circuits and other conductors as thin films on dielectric substrates.

High Q and low loss RF components with operating frequencies from DC to 20 GHz or more can be realized using ceramics and other dielectric materials having a relatively high relative permittivity, $\varepsilon_r$. Representative ceramic materials include, among others, aluminum oxide and aluminum nitride ($\varepsilon_r$ between about 8 and 100), strontium titanate ($\varepsilon_r$ of about 310) and barium titanate ($\varepsilon_r$ of about 500). Ceramics, particularly temperature-compensating Electronic Industry Alliance (EIA) Class 1 ceramic materials, like COG, also have good temperature stability, from as low as −55° C. to as high as 125° C. Additionally, the permittivity properties of ceramics permit construction of RF filters and other RF components that are physically smaller than the signal's wavelength in free space. Thin-film ceramic RF components described herein can be fabricated with small footprints having an area between 2 mm$^2$ and 500 mm$^2$ suitable for use in small-scale RF systems, devices and subassemblies. Such thin-film ceramic RF components can comprise Q factors between 10 and 500 and an insertion loss between 0.3 dB and 10 dB.

Alternatively, the dielectric substrate can comprise Rogers printed circuit board (PCB) material, silicon, quartz, sapphire, glass, and conventional epoxy resin PCB board (e.g., FR-4), among other dielectrics. But these and other dielectrics generally have lower relative permittivity and less temperature stability than ceramics. For example, silicon has a relative permittivity of about 11.68, and FR-4 has a relative permittivity of about 4.4. Thus FR-4 and some non-ceramic dielectric materials may not be suitable for use in applications with relatively high Q requirements and operational frequencies above 1 GHz. Also, an RF component comprising a ceramic dielectric can be up to 20 times smaller than an RF component comprising FR-4.

Conductors can be deposited on dielectric substrates using various deposition processes and techniques. Thin films can be deposited using vapor deposition and photolithographic patterning techniques. Vapor deposition includes physical vapor deposition (PVD), also known as sputtering, and various chemical vapor deposition (CVD) processes. Thin-film planar transmission lines and other conductors (e.g., ground planes, shields, vias, flanges, interface pads, etc.) have a thickness typically ranging from fractions of a nanometer to several micrometers, more or less.

Alternatively, in lieu of thin-film technology, the conductors can be fabricated as thick films deposited on dielectric substrates using screen printing techniques or as conductive traces printed or etched on circuit boards like FR-4. However, vapor deposition processes provide more precise patterning with tighter tolerances and less product variation compared to thick-film process and printed circuit board (PCB) fabrication techniques. PVD and other vapor deposition processes also permit fabrication of smaller structures than thick-film processes. Thick-film devices have a typical thickness between 0.0001 mm and 0.1 mm, more or less. Traces on FR-4 are thicker still. Nevertheless, the multilayer RF components described herein can be fabricated using thick-film processes and PCB technology.

Figure 2:
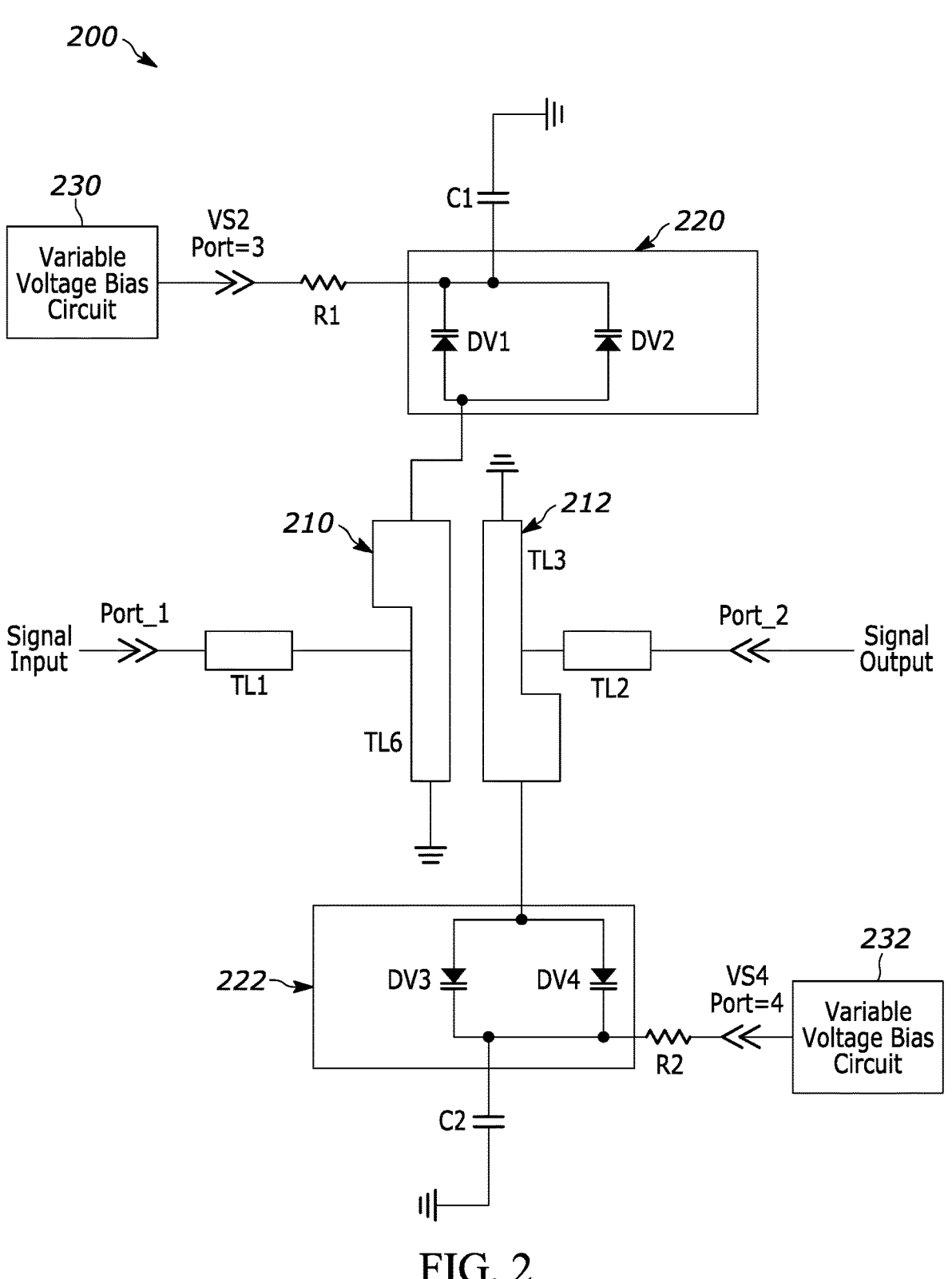
FIG. 2 is a schematic block diagram of a varactor-tunable RF resonant circuit configurable as a second-order filter.
Figure 3:
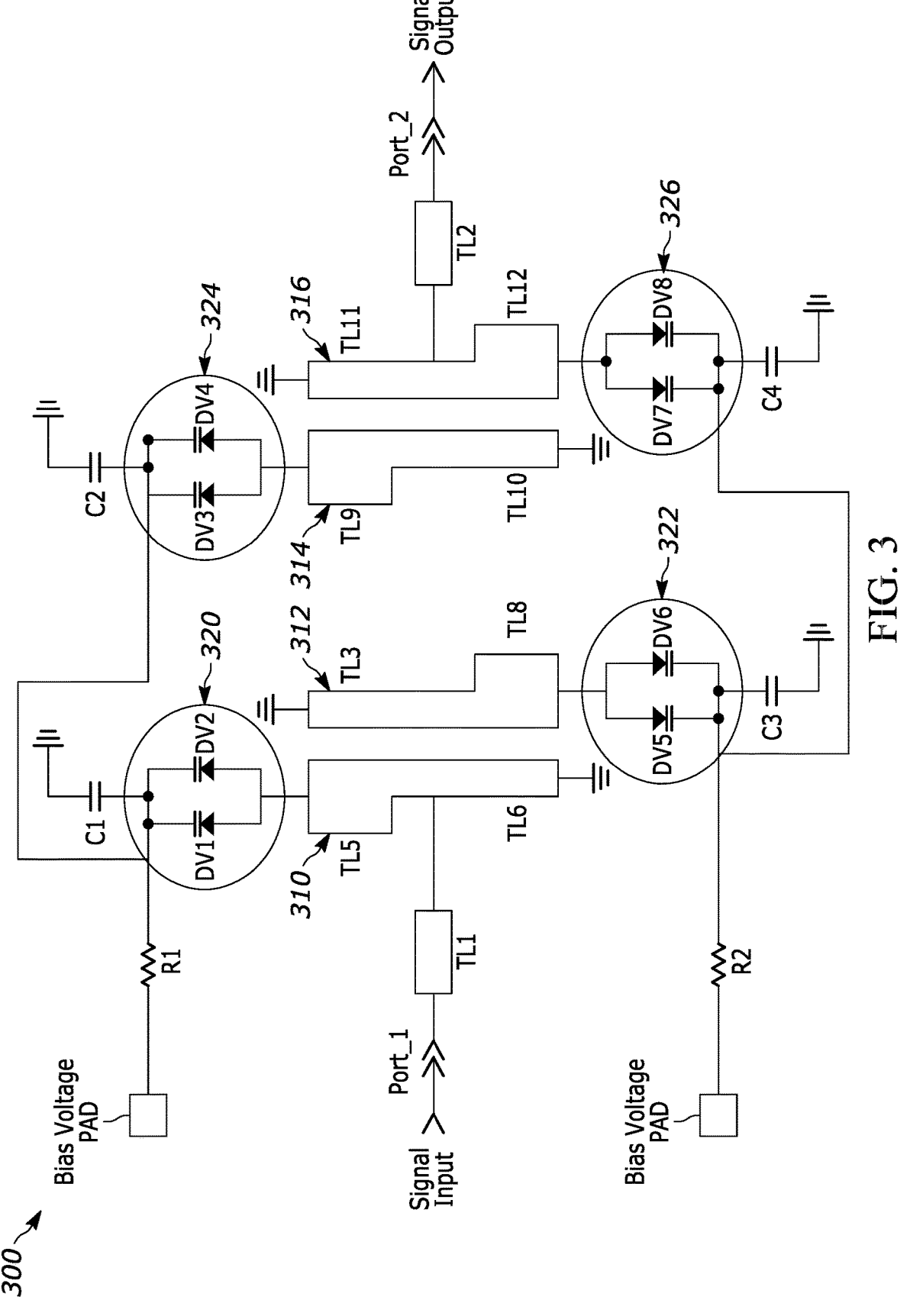
FIG. 3 is a schematic block diagram of a varactor-tunable RF resonant circuit configurable as a fourth-order filter.
Figure 4:
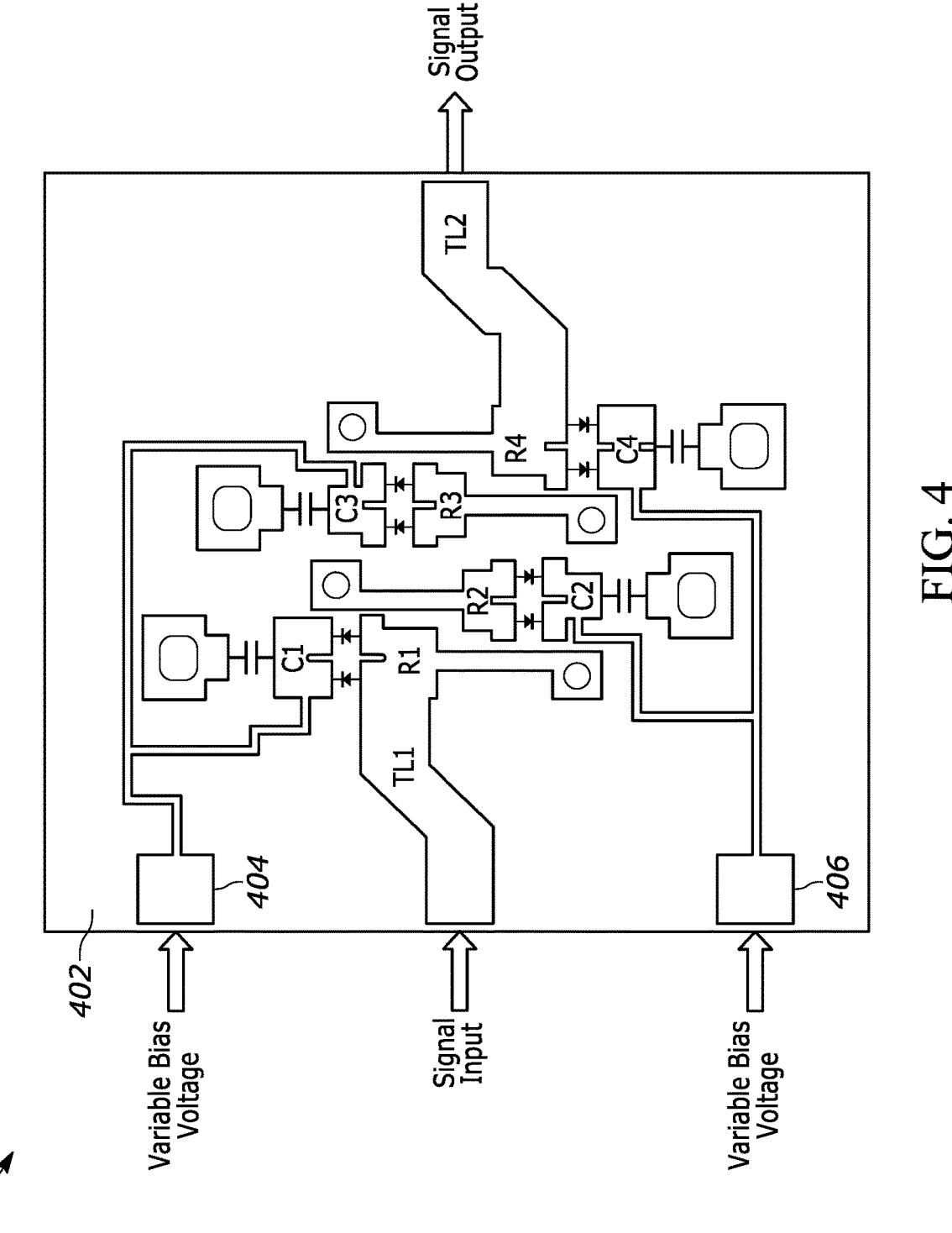
FIG. 4 is a representative partial implementation of a varactor-tunable RF resonant circuit configured as a fourth-order filter.

The planar transmission line generally comprises one or more resonators coupled to input and output feed lines, on a dielectric substrate. In FIG. 1, the tunable RF resonant circuit 100 comprises a single resonator 110. In FIG. 2, the tunable RF resonant circuit 200 comprises two discrete resonators 210, 212 configured as a second-order RF component, for example, a filter. In FIG. 3, the tunable RF resonant circuit 300 comprises four discrete resonators 310, 312, 314 and 316 configured as a fourth-order RF component. Other tunable RF resonant circuits can be configured as higher order RF components. Generally, "n" discrete resonators can be electromagnetically coupled to form an $n^{th}$-order RF device. For example, the tunable RF resonant circuit can be configured as an $n^{th}$-order low-pass, band-pass, high-pass or notch filter through appropriate patterning of one or more resonators on the dielectric substrate. A single resonator could be implemented as a high-Q notch filter or as a reflectionless filter. Multiple resonators are generally required to create a defined passband. The schematic circuits of FIGS. 1-3 can be implemented on a dielectric substrate as described herein. FIG. 4 is a representative implementation of a partial RF filter circuit 400 as described further below.

The input and output feed lines are generally electrically coupled to the resonators, either by a direct electrical connection or electromagnetic coupling. The feed lines can be implemented as planar transmission lines or other conductors disposed on the dielectric substrate. In FIG. 1, the resonator 110 is connected to input and output planar transmission feed lines TL1, TL2. In FIG. 2, the input feed-line TL1 is connected to the first resonator 210 and the output feed-line TL2 is connected to the second resonator 212. In FIG. 3, the input feed-line TL1 is connected to the first resonator 310 and the output feed-line TL2 is connected to the fourth resonator 316. In other implementations, alternatively, some or all of the feed lines are spaced apart from and electromagnetically coupled to the resonators in lieu of direct connections. As used herein, an input or output feed-line "coupled" to a resonator means that the feed-line is connected directly to the resonator or that the feed-line is spaced apart from, and electromagnetically coupled to, the resonator.

A varactor-tunable RF resonant circuit generally comprises at least one voltage-controlled varactor diode electrically connecting a corresponding resonator to a reference node. The reference node can be electrical ground or some other reference voltage. In some implementations, the tunable RF resonant circuit comprises a plurality of voltage-controlled varactor diodes arranged in parallel on the dielectric substrate and electrically connecting each of the one or more corresponding resonators to the reference node. Thus configured, the resonant frequency (e.g., center frequency) of the one or more resonators, and hence RF resonant circuit, can be tuned by appropriate control of the capacitance of the one or more voltage-controlled varactor diodes connected to each of the one or more resonators.

In FIG. 1, the voltage-controlled varactor diodes 120 comprises two parallel voltage-controlled varactor diodes DV1, DV2 connecting the resonator 110 to the reference node. In other implementations, more than two such varactor diodes can be arranged in parallel. In FIG. 2, a first plurality of parallel voltage-controlled varactor diodes 220 connect the first resonator 210 to the reference node, and a second plurality of parallel voltage-controlled varactor diodes 222 connect the second resonator 212 to the reference node. Similarly, in FIG. 3, a first plurality of parallel voltage-controlled varactor diodes 320 connect the first resonator 310 to the reference node, a second plurality of parallel voltage-controlled varactor diodes 322 connect the second resonator 312 to the reference node, a third plurality of parallel voltage-controlled varactor diodes 324 connect the third resonator 314 to the reference node, and a fourth plurality of parallel voltage-controlled varactor diodes 326 connect the fourth resonator 316 to the reference node. The one or more voltage-controlled varactor diodes are electrically coupled to the corresponding resonator at a tap point. In FIGS. 1-3, the tunable RF resonant circuit includes lobe TL6 and signal input port Port_1. In FIG. 1, the tunable RF resonant circuit includes voltage bias circuit port VS2 Port=2. In FIGS. 2-3, the tunable RF resonant circuit includes lobe TL3 signal output port Port_2, and voltage-controlled varactor diodes DV3 and DV4. In FIG. 2, the tunable RF resonant circuit includes voltage bias circuit port VS2 Port=3 and voltage bias circuit port VS4 Port=4. In FIG. 3, the tunable RF resonant circuit includes lobes TL5 and TL8-TL12 and voltage-controlled varactor diodes DV5-DV8.

Each voltage-controlled varactor diode has an equivalent series resistance (ESR). The parallel arrangement of voltage-controlled varactor diodes can reduce the overall resistance between a particular resonator and the reference node compared to a single voltage-controlled varactor diode having an equivalent capacitance value. Thus in tunable RF resonant circuit implementations comprising a parallel arrangement of voltage-controlled varactor diodes connecting a corresponding resonator to the reference node, the resonant circuit has reduced insertion loss compared to a like resonant circuit comprising a single voltage-controlled varactor diode (in lieu of the parallel arrangement of voltage-controlled varactor-diodes), assuming the capacitance of the single voltage-controlled varactor diode is equivalent to the capacitance of the parallel arrangement of voltage-controlled varactor diodes.

The one or more resonators of the varactor-tunable RF resonant circuit can have various shapes depending on the use case or application. In some implementations, the one or more resonators each comprise two or more portions having different impedances. Portions of the resonator having a smaller sectional area generally have a higher impedance than portions of the resonator having a larger sectional area. The different impedances are attributable to portions of the resonator having different cross-sectional areas. In FIG. 1, the resonator 110 is a stepped impedance resonator comprising a high impedance lobe 112 and a low impedance lobe 114, wherein a sectional area of the low impedance lobe is greater than a sectional area of the high impedance lobe. In other implementations, the resonator can include more than two steps. The stepped impedance permits modification of both broadband and in-band performance of the resonator.

Thus configured, harmonics can move farther away from in-band frequencies compared to more traditional interdigital resonators.

A capacitance of the one or more voltage-controlled varactor diodes can be controlled by controlling a reverse bias voltage applied to the one or more voltage-controlled varactor diodes connecting the corresponding resonator to the reference node. Thus, a resonant frequency of the RF resonant circuit can be tuned by configuration of the bias voltage applied to the one or more voltage-controlled varactor diodes. The bias voltage can be generated by a variable DC voltage bias circuit connected to one or more bias voltage contacts on the dielectric substrate. The bias voltage can be supplied by a common voltage source or by different voltage sources depending on circuit topology and layout considerations. The bias voltage applied to the one or more voltage-controlled varactor diodes of one resonator can be the same as the bias voltage applied to the one or more voltage-controlled varactor diodes of the other resonators. In other implementations however it may be desirable to apply different bias voltages to the one or more voltage-controlled varactor diodes associated with the different resonators using voltage divider networks or using different variable voltage bias circuits.

In one representative implementation, with reference to FIG. 1, a variable DC voltage bias circuit is a digitally-controlled variable DC voltage bias circuit 130, wherein the output bias voltage is a function of a digital input signal (e.g., a digital word) applied to the input of the variable DC voltage bias circuit. One or more such digitally-controlled variable DC voltage bias circuits can also bias the voltage-controlled varactors of FIGS. 2 and 3. In other implementations, the variable DC voltage bias circuit can be implemented as an analog circuit. In FIG. 2, variable DC voltage bias circuits 230, 232 apply a DC bias voltage to each of the plurality of voltage-controlled varactor diodes 220, 222, respectively. These bias voltages can be the same or different as suggested herein.

A DC-blocking capacitor can connect the voltage-controlled varactor diodes to the reference node. Such a capacitor is typically a fixed value capacitor but it can be variable. In some implementations, the bias voltage is applied to the voltage-controlled varactor diode by a resistor. The resistor and blocking capacitor form a low-pass filter connecting the one or more voltage-controlled varactor diodes to the reference node. The cutoff frequency of the low-pass filter can be set by appropriate selection of values for the resistor and blocking capacitor. The resistor can also limit current supplied by the variable DC voltage bias circuit. In FIG. 1, resistor $R_1$ connects the variable DC voltage bias circuit 130 to the plurality of voltage-controlled varactor diodes 120 and a DC blocking capacitor $C_1$ connects the plurality of voltage-controlled varactor diodes to the reference node. In FIGS. 2 and 3, the voltage-controlled varactor diodes are also connected to referenced nodes by corresponding low-pass filters. In FIG. 3, the voltage-controlled varactor diodes 320 and 324 are connected to a common variable DC bias voltage circuit by a resistor $R_1$ and can be connected to the reference node by a common DC blocking capacitor instead of corresponding DC blocking capacitors $C_1$ and $C_2$.

In FIG. 4, the representative implementation of a fourth-order varactor-tunable RF circuit 400 comprises a thin-film planar impedance-controlled transmission line deposited on a dielectric substrate 402 as described herein. Nevertheless, one or more varactor diodes connect each resonator $R_1$, $R_2$, $R_3$ and $R_4$ to a corresponding contact $C_1$, $C_2$, $C_3$, and $C_4$, as described herein. The transmission line comprises an input feed-line $TL_1$, a first resonator $R_1$, a second resonator $R_2$, a third resonator $R_3$, a fourth resonator $R_4$, and an output feed-line $TL_2$. The input and output feed lines $TL_1$ and $TL_2$ are connected to corresponding portions of the first and fourth resonators $R_1$ and $R_4$, respectively. Impedance matching between the feed lines and resonators can be realized by matching the sectional areas of the connecting portions of the feed lines and resonators. The tunable RF circuit also comprises bias voltage contacts 404, 406 connectable to a variable DC voltage bias circuit not shown in FIG. 4, but described herein and shown in other drawings.

Figure 5:
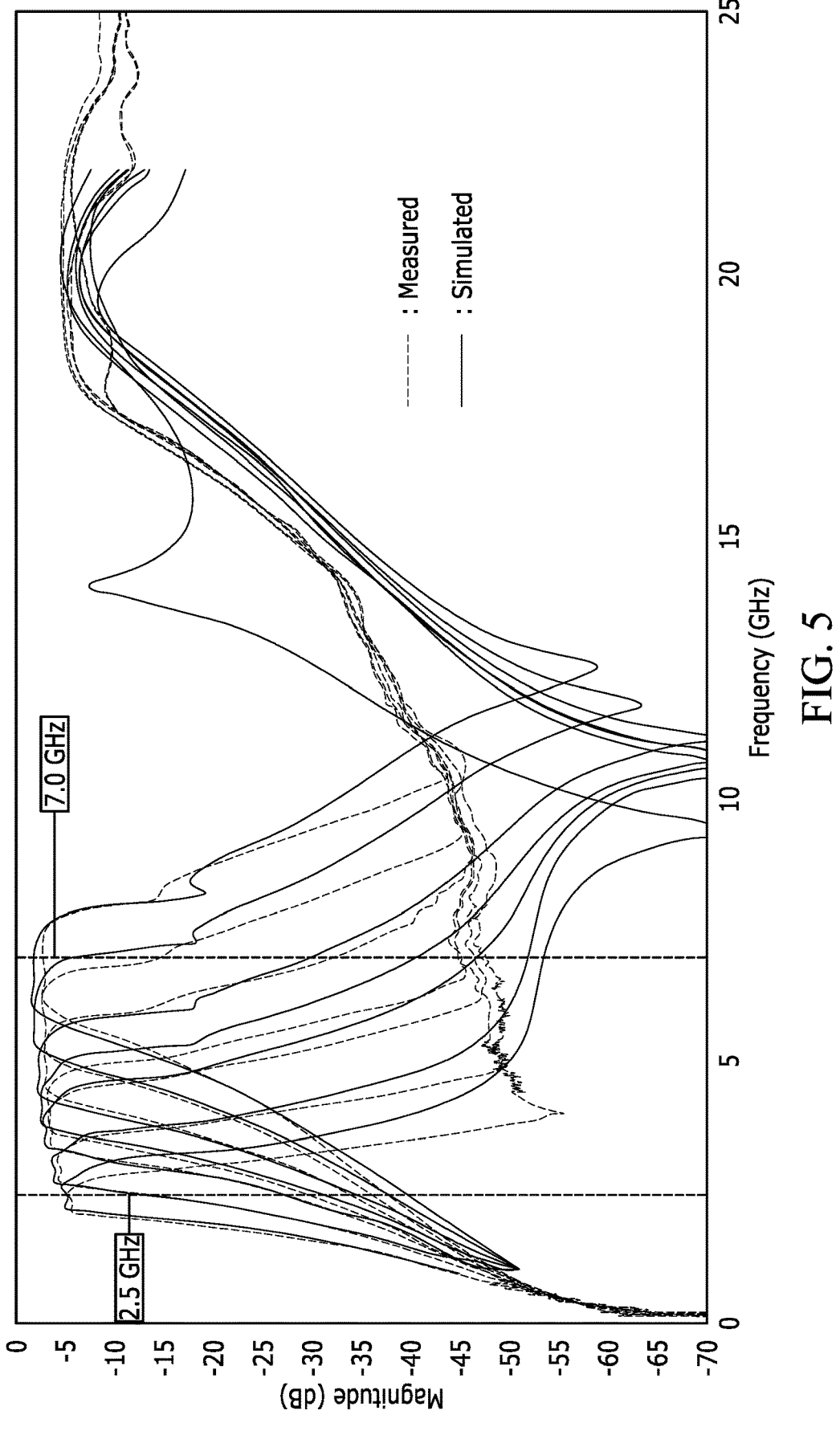
FIG. 5 illustrates simulated and measured wideband frequency response plots for a varactor-tunable RF filter circuit with parallel varactors associated with each resonator.

FIG. 5 illustrates simulated and measured wideband frequency response plots for a fourth-order varactor-tunable RF filter circuit with parallel varactor diodes associated with each resonator. The RF filter circuit is tunable over nearly the entire S-band frequency, between 2.5 GHz and 7.0 GHz. The plots illustrate the accuracy with which simulation predicts the performance of a physical implementation over this frequency range.

Figure 6:
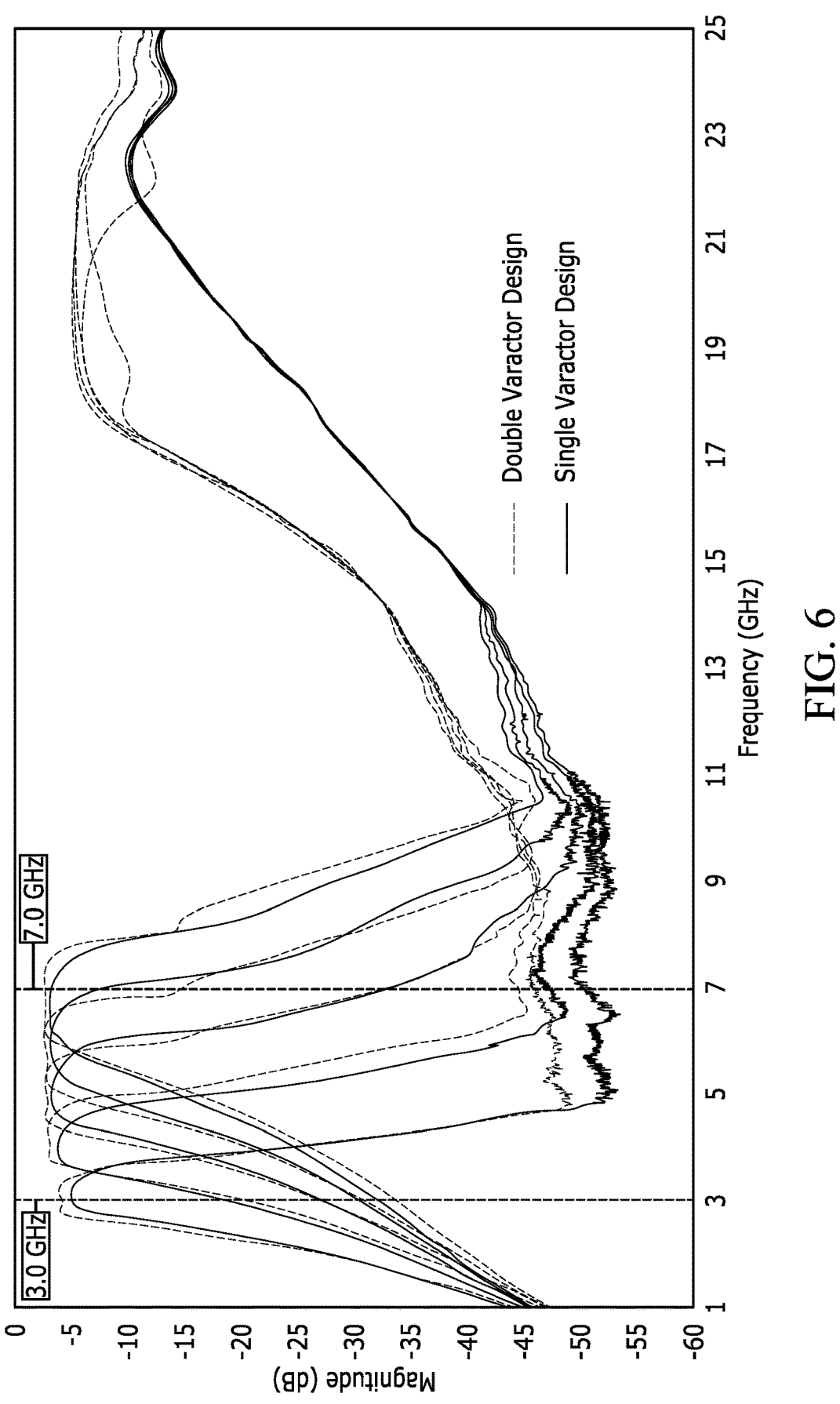
FIG. 6 illustrates comparative wideband frequency response plots, based on measured data, for two varactor-tunable RF filter circuits, one with a single varactor and the other with parallel varactors associated with each resonator.

FIG. 6 illustrates comparative wideband frequency response plots, based on measured data, for two fourth-order varactor-tunable RF filter circuits. One RF filter circuit comprises a single varactor diode associated with each resonator and the other RF filter circuit comprises two parallel varactor diodes associated with each resonator, wherein the capacitance of each single varactor in one RF filter circuit is equivalent to the capacitance of the corresponding parallel capacitors in the other RF filter circuit. The plots illustrate that both RF filters are tunable between 3.0 GHz and 7.0 GHz by variation of varactor capacitance between about 0.4 pF and about 2.4 pF. The plots also show that the RF filter with parallel varactor diodes has better insertion loss than the RF filter with a single varactor diode.

In one implementation, a varactor-tunable radio frequency (RF) resonant circuit comprises a planar impedance-controlled transmission line disposed on a dielectric substrate. A first plurality of voltage-controlled varactor diodes arranged in parallel electrically connect a first resonator on the dielectric substrate to a reference node, wherein a frequency of the first resonator is tunable by configuration of a reverse bias voltage applied to the first plurality of voltage-controlled varactor diodes. Such a varactor-tunable RF resonant circuit comprises reduced insertion loss compared to a like varactor-tunable RF resonant circuit comprising a single voltage-controlled varactor diode having the same capacitance as the first plurality of voltage-controlled varactor diodes arranged in parallel.

The varactor-tunable RF resonant circuit can optionally comprise a second resonator spaced apart from the first resonator, the first resonator coupled to an input feed-line and the second resonator coupled to an output feed-line, and a second plurality of voltage-controlled varactor diodes arranged in parallel and electrically interconnecting the second resonator and the reference node, wherein a frequency of the second resonator is tunable by configuration of a reverse bias voltage applied to the second plurality of voltage-controlled varactor diodes. Additional resonators connected to the reference node by corresponding voltage-controlled varactor diodes can be located between the first and second resonators.

In the foregoing implementations, optionally, the one or more resonators can each comprise a high-impedance lobe and a low-impedance lobe, the planar impedance-controlled transmission line can be a thin-film microstrip and the dielectric substrate can be a ceramic, a low-pass filter circuit can connect each of the plurality of voltage-controlled varactor diodes to the reference node. The varactor-tunable RF resonant circuit can further comprise a bias voltage contact disposed on the dielectric substrate and electrically connected to the first plurality of voltage-controlled varactor diodes. The varactor-tunable RF resonant circuit can be connected to or combined with a variable voltage bias circuit electrically connected to the first plurality of voltage-controlled varactor diodes and configured to adjustably reverse bias the first plurality of varactor diodes. The varactor-tunable RF resonant circuit be configured as a tunable filter, antenna or oscillator among other components.

In another implementation, a varactor-tunable radio frequency (RF) resonant circuit comprises a thin-film planar impedance-controlled transmission line disposed on a ceramic substrate, the thin-film planar impedance-controlled transmission line comprising a resonator comprising a low impedance lobe and a high impedance lobe. A voltage-controlled varactor diode electrically connects the low impedance lobe to a reference node, wherein a frequency of the resonator is tunable by configuration of a reverse bias voltage applied to the plurality of voltage-controlled varactor diodes. Optionally, the varactor-tunable RF resonant circuit can comprise a plurality of resonators disposed on the ceramic substrate, and a corresponding voltage-controlled varactor diode electrically connects each resonator to the reference node, wherein a frequency of the RF resonant circuit is tunable by configuration of a reverse bias voltage applied to the voltage-controlled varactor diodes.

While the disclosure and what is presently considered to be the best mode thereof has been described in a manner establishing possession and enabling those of ordinary skill in the art to make and use the same, it will be understood and appreciated that there are many equivalents to the representative embodiments described herein and that myriad modifications and variations may be made thereto without departing from the scope and spirit of the invention, which is to be limited not by the embodiments described, but by the appended claims and their equivalents.

What is claimed is:

1. A varactor-tunable radio frequency (RF) resonant circuit comprising:
  a planar impedance-controlled transmission line disposed on a dielectric substrate,
  the planar impedance-controlled transmission line comprising a first resonator;
  a first plurality of voltage-controlled varactor diodes arranged in parallel on the dielectric substrate and electrically interconnecting the first resonator and a reference node,
  wherein a frequency of the first resonator is tunable by configuration of a reverse bias voltage applied to the first plurality of voltage-controlled varactor diodes.

2. The varactor-tunable RF resonant circuit of claim 1 comprising reduced insertion loss compared to a like varactor-tunable RF resonant circuit comprising a single voltage-controlled varactor diode having the same capacitance as the first plurality of voltage-controlled varactor diodes arranged in parallel.

3. The varactor-tunable RF resonant circuit of claim 1, wherein the first resonator comprises a high-impedance lobe and a low-impedance lobe.

4. The varactor-tunable RF resonant circuit of claim 1, the planar impedance-controlled transmission line is a thin-film microstrip and the dielectric substrate is ceramic.

5. The varactor-tunable RF resonant circuit of claim 1 further comprising a low-pass filter circuit connecting the first plurality of voltage-controlled varactor diodes to the reference node.

6. The varactor-tunable RF resonant circuit of claim 1 further comprising a bias voltage contact disposed on the dielectric substrate and electrically connected to the first plurality of voltage-controlled varactor diodes.

7. The varactor-tunable RF resonant circuit of claim 1 further comprising a variable voltage bias circuit electrically connected to the first plurality of voltage-controlled varactor diodes and configured to adjustably reverse bias the first plurality of varactor diodes.

8. The varactor-tunable RF resonant circuit of claim 1 is a tunable filter component,
  the planar impedance-controlled transmission line further comprising a second resonator spaced apart from the first resonator, the first resonator coupled to an input feed-line and the second resonator coupled to an output feed-line;
  a second plurality of voltage-controlled varactor diodes arranged in parallel and electrically interconnecting the second resonator and the reference node,
  wherein a frequency of the second resonator is tunable by configuration of a reverse bias voltage applied to the second plurality of voltage-controlled varactor diodes.

9. The varactor-tunable RF resonant circuit of claim 8 further comprising a low-pass filter circuit connecting the first and second pluralities of voltage-controlled varactor diodes to the reference node.

10. A varactor-tunable radio frequency (RF) resonant circuit comprising:
  a thin-film planar impedance-controlled transmission line disposed on a dielectric substrate,
  the thin-film planar impedance-controlled transmission line comprising a first resonator;
  a first plurality of voltage-controlled varactor diodes arranged in parallel on the dielectric substrate and electrically interconnecting the first resonator and a reference node,
  wherein a frequency of the first resonator is tunable by configuration of a reverse bias voltage applied to the first plurality of voltage-controlled varactor diodes.

11. The varactor-tunable RF resonant circuit of claim 10 comprising reduced insertion loss compared to a like varactor-tunable RF resonant circuit comprising a single voltage-controlled varactor diode having the same capacitance as the first plurality of voltage-controlled varactor diodes arranged in parallel.

12. The varactor-tunable RF resonant circuit of claim 11 is a tunable filter component,
  the planar impedance-controlled transmission line further comprising a second resonator spaced apart from the first resonator, the first resonator coupled to an input feed-line and the second resonator coupled to an output feed-line;
  a second plurality of voltage-controlled varactor diodes arranged in parallel and electrically interconnecting the second resonator and the reference node,
  wherein a frequency of the second resonator is tunable by configuration of a reverse bias voltage applied to the second plurality of voltage-controlled varactor diodes.

13. The varactor-tunable RF resonant circuit of claim 12 further comprising a bias voltage contact disposed on the dielectric substrate and electrically connected to the first and second pluralities of voltage-controlled varactor diodes.

14. The varactor-tunable RF resonant circuit of claim 12, wherein the first and second resonators each comprise a high-impedance lobe and a low-impedance lobe.

15. The varactor-tunable RF resonant circuit of claim 12 further comprising a low-pass filter circuit connecting the first plurality of voltage-controlled varactor diodes to the reference node.

16. The varactor-tunable RF resonant circuit of claim 12 further comprising a variable voltage bias circuit electrically connected to the first and second pluralities of voltage-controlled varactor diodes and configured to adjustably reverse bias the first and second pluralities of varactor diodes.

17. A varactor-tunable radio frequency (RF) resonant circuit comprising:

a thin-film planar impedance-controlled transmission line disposed on a ceramic substrate, a resonator disposed on the ceramic substrate, the resonator comprising a high-impedance lobe and a low-impedance lobe;

a voltage-controlled varactor diode electrically connecting the low-impedance lobe of the resonator to a reference node, wherein a frequency of the resonator is tunable by configuration of a reverse bias voltage applied to the voltage-controlled varactor diode.

18. The varactor-tunable RF resonant circuit of claim 17 further comprising:

a plurality of resonators disposed on the ceramic substrate, the plurality of resonators including the resonator;

input and output feed lines coupled to the plurality of resonators, a plurality of voltage-controlled varactor diodes each electrically connecting each resonator to the reference node, the plurality of voltage-controlled varactor diodes including the voltage-controlled varactor diode, wherein a frequency of the RF resonant circuit is tunable by configuration of the reverse bias voltage applied to the plurality of voltage-controlled varactor diodes.

19. The varactor-tunable RF resonant circuit of claim 18, wherein each resonator comprises a high-impedance lobe and a low-impedance lobe and a respective voltage-controlled varactor diode is electrically connected to the low-impedance lobe of the corresponding resonator.

20. The varactor-tunable RF resonant circuit of claim 18 further comprising a bias voltage contact disposed on the ceramic substrate and electrically connected to the plurality of voltage-controlled varactor diodes.

\* \* \* \* \*